United States Patent
Kim et al.

(10) Patent No.: US 7,768,013 B2
(45) Date of Patent: Aug. 3, 2010

(54) VERTICAL STRUCTURE THIN FILM TRANSISTOR

(75) Inventors: Seong Hyun Kim, Daejeon (KR); Taehyoung Zyung, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/722,818

(22) Filed: Nov. 25, 2003

(65) Prior Publication Data

US 2004/0113152 A1 Jun. 17, 2004

(30) Foreign Application Priority Data

Dec. 14, 2002 (KR) .................... 10-2002-0079990

(51) Int. Cl.
*H01L 29/10* (2006.01)
*H01L 29/786* (2006.01)

(52) U.S. Cl. ..................... 257/60; 257/328

(58) Field of Classification Search ........ 257/135, 257/72, 328, 329, 60, 263
See application file for complete search history.

(56) References Cited

U.S. PATENT DOCUMENTS

| | | | | |
|---|---|---|---|---|
| 4,949,141 A * | 8/1990 | Busta | ........................... | 349/47 |
| 4,996,573 A * | 2/1991 | Hack et al. | ..................... | 257/60 |
| 5,817,550 A * | 10/1998 | Carey et al. | .................. | 438/166 |
| 6,215,130 B1 * | 4/2001 | Dodabalapur | ................. | 257/67 |
| 2003/0213952 A1 * | 11/2003 | Iechi et al. | ...................... | 257/40 |

FOREIGN PATENT DOCUMENTS

| | | |
|---|---|---|
| JP | 07-074360 | 1/1994 |
| JP | P1995-0007154 | 1/2001 |
| JP | P2001-0034186 | 4/2001 |

OTHER PUBLICATIONS

"Vertical p-type high-mobility heterojunction metal-oxide-semiconductor field-effect transistors", X. Chen, et al., 2001 American Institute of Physics.

Applied Physics Letters, "Conductance quantization in nanoscale vertical structure silicon field-effect trnsistors witha wrap gate", K. Nishiguchi, et al., 2000 American Institute of Physics.

* cited by examiner

*Primary Examiner*—T. N. Quach
(74) *Attorney, Agent, or Firm*—Blakely, Sokoloff, Taylor & Zafman

(57) ABSTRACT

A vertical structure thin film transistor is provided. The vertical structure thin film transistor has a stacked structure of a substrate, a first electrode, a dielectric thin film, a second electrode, a semiconductor thin film, and a third electrode, wherein current flows between the second and third electrodes perpendicularly to the substrate and is modulated by an electric field generated from the first electrode parallel to the current.

8 Claims, 1 Drawing Sheet

VERTICAL STRUCTURE THIN FILM TRANSISTOR

This application claims the priority of Korean Patent Application No. 2002-79990, filed on Dec. 14, 2002, the disclosure of which is incorporated herein by reference in its entirety.

BACKGROUND OF THE INVENTION

1. Field of the Invention

The present invention relates to a semiconductor thin film transistor (TFT), and more particularly to a TFT which allows current to flow in a vertical direction with respect to the surface of a semiconductor thin film.

2. Description of the Related Art

Generally, a thin film transistor (TFT) is defined as a field effect transistor (FET) made by forming a semiconductor thin film on an insulating substrate. Like the FET, the TFT is a device with three terminals, i.e., gate, source, and drain, and is mainly used as a switch. Although it is used in a sensor, a memory device, and an optical device, the TFT is mainly used as a pixel-switching device for an active matrix flat panel display. In particular, the TFT is widely used as a pixel-switching device or a current-driving device for a liquid crystal display or an organic electroluminescent display.

A TFT with an amorphous silicon semiconductor thin film generally has a horizontal structure as shown in FIG. 1. Referring to FIG. 1, a first electrode 20, which serves as a gate, is formed on a substrate 10 and a dielectric thin film 30 is formed on the first electrode 20. An amorphous silicon thin film 60 is formed on the dielectric thin film 30. A second electrode 40 and a third electrode 50, which serve as a source and a drain, respectively, are formed on the amorphous silicon thin film 60 in such a way as to be spaced apart from each other. Various modifications in the positions and shapes of the dielectric thin film 30, the amorphous silicon thin film 60, and the first, second, and third electrodes 20, 40, and 50 may be made. However, every type of TFT has a common on/off switching operation, that is, current flows between the second electrode 40 and the third electrode 50, and an electric field generated by a voltage applied to the first electrode 20 acts on the current perpendicularly to the current direction.

Here, provided that the thickness and width of a channel formed in the amorphous silicon thin film 60 are designated t and L, respectively, current flows through the channel with a cross sectional area of t×L. Generally, since the thickness t is in the range of several nanometers to several tens of nanometers, a change in the thickness t insignificantly contributes to an increase in the total current. Therefore, current flows through the channel with a very small cross sectional area adjacent to the interface between the amorphous silicon thin film 60 and the dielectric thin film 30, which makes it difficult to increase the switching speed of a TFT.

SUMMARY OF THE INVENTION

The present invention provides a thin film transistor (TFT) which provides a large current flow and a high driving speed by allowing current to flow perpendicularly to, not parallel to, the surface of a semiconductor thin film.

According to an aspect of the present invention, there is provided a TFT having a stacked structure of a substrate, a first electrode, a dielectric thin film, a second electrode, a semiconductor thin film, and a third electrode, wherein current flows between the second and third electrodes perpendicularly to the substrate and is modulated by an electric field generated by the first electrode parallel to the current.

The second electrode may be divided into several electrode portions spaced apart from each other so that the electric field generated by the first electrode acts on the semiconductor thin film to induce a charge.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
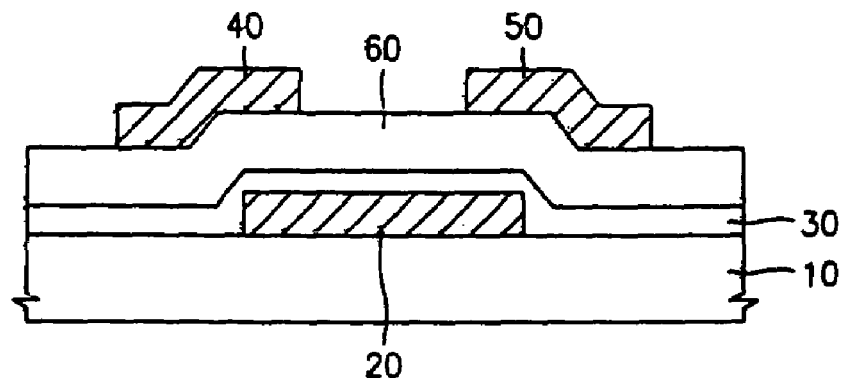
FIG. 1 is a view of a conventional inorganic semiconductor thin film transistor.

The present invention will be described more fully hereinafter with reference to the accompanying drawings in which preferred embodiments of the invention are shown. The invention may, however, be embodied in many different forms and should not be construed as being limited to the embodiments. set for the herein. Rather, these embodiments are provided so that this disclosure will be thorough and complete, and will fully convey the scope of the invention to those skilled in the art. In the drawings, the forms of elements are exaggerated for clarity.

Figure 2:
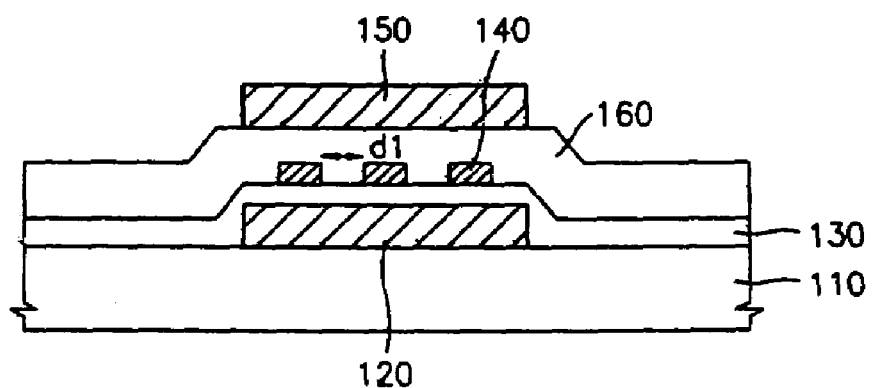
FIG. 2 is a view of a vertical structure inorganic semiconductor thin film transistor according to an embodiment of the present invention.

FIG. 2 is a view of a vertical structure inorganic semiconductor thin film transistor (TFT) according to an embodiment of the present invention. The inorganic semiconductor TFT is realized by thin film technologies, which will be described in detail later.

Referring to FIG. 2, a first electrode 120 made of a conductive material is formed on a substrate 110 and a dielectric thin film 130 is formed on the first electrode 120. A second electrode 140 made of another conductive material is formed on the dielectric thin film 130. An inorganic semiconductor thin film 160 and a third electrode 150 are formed sequentially on the second electrodes 140. That is, the first electrode 120, the dielectric thin film 130, the second electrode 140, the inorganic semiconductor thin film 160, and the third electrode 150 are formed sequentially on the substrate 110 to form a stacked structure when viewed from bottom to top as in FIG. 2. However, such a stacking sequence may be changed. For example, the third electrode, the semiconductor thin film, the second electrode, the dielectric thin film, and the first electrode may be formed sequentially formed on the substrate. A passivation film (not shown) may be formed on the upper surface of the stacked structure shown in FIG. 2 to protect the stacked structure from external physical impacts or chemical pollutants. The passivation film is typically made of SiNx.

In the structure shown in FIG. 2, the first electrode 120 corresponds to a gate. The second electrode 140 and the third electrode 150 correspond to a source and a drain, respectively, but the opposite case is possible as well. In this case, current flows between the second electrode 140 and the third electrode 150 along a conduction path with a cross sectional area equal to the upper surface area of the second electrode 140. The direction of the current is perpendicular to the upper surface of the substrate 110, i.e., perpendicular to the upper surface of the inorganic semiconductor thin film 160. The direction of an electric field generated by a voltage applied to the first electrode 120 is parallel to the direction of the current. Therefore, according to the present invention, the current flowing between the second electrode 140 and the third electrode 150 is modulated by the electric field generated in parallel to the direction of the current.

When the second electrode 140 covers the whole surface of the dielectric thin film 130, the electric field generated from the first electrode 120 is interrupted by the second electrode 140. Therefore, it is preferable to divide the second electrode 140 into several electrode portions which are separated from each other by a predetermined gap d1, so that the electric field can act on the inorganic semiconductor thin film 160. If the gap d1 increases, a large amount of charge is induced due to a large electric field, but the current decreases. On the other hand, if the gap d1 decreases, the current increases, but the electric field insignificantly acts on the inorganic semiconductor thin film 160, thereby inducing a small amount of charge. Therefore, the electrode portions of the second electrode 140 must be separated from each other by an appropriate gap according to the device's demand. In this case, the amount of the current and charge induced must be considered.

The substrate 110 may be selected from a glass substrate, a monocrystalline silicon (Si) substrate, or a plastic substrate according to the process condition. In a case where the inorganic semiconductor thin film 160 is made of amorphous Si, deposition can be carried out at a substrate temperature of 350° C. or less, thereby enabling the use of an inexpensive glass substrate with a large surface area. On the other hand, in a case where the inorganic semiconductor thin film 160 is made of monocrystalline or polycrystalline Si, Ga, Ge, or a mixture thereof, it is preferable to use a monocrystalline Si substrate since a deposition process at a high temperature is required. In this regard, for example, when the inorganic semiconductor thin film 160 is made of amorphous Si, the substrate 110 may be a glass substrate, the first electrode 120 may be made of Cr, the dielectric thin film 130 may be made of SiNx, and the second and third electrodes 140 and 150 may be made of Al/Ta/Al/Cr.

For the inorganic semiconductor thin film 160, amorphous, polycrystalline, or monocrystalline Si, Ga, Ge, or a mixture thereof is deposited by chemical vapor deposition (CVD), and then patterned by a photolithographic dry or wet etching process. When a voltage is applied to the first electrode 120, the dielectric thin film 130 allows charge from the inorganic semiconductor thin film 160 to concentrate on the interface between the dielectric thin film 130 and the inorganic semiconductor thin film 160 to form a channel, without a charge leakage into the first electrode 120. In this regard, the dielectric thin film 130 must have a relatively good insulating property at a low temperature. If the inorganic semiconductor thin film 160 is made of amorphous Si, the dielectric thin film 130 is typically made of SiNx. On the other hand, if the inorganic semiconductor thin film 160 is made of polycrystalline Si, the dielectric thin film 130 is typically made of SiOx. This is because charge is easily accumulated and the voltage-current (V-I) characteristics show hysteresis. The dielectric thin film 130 is deposited by using plasma enhanced CVD (PECVD) with tetraethylorthosilicate (TEOS), low pressure CVD (LPCVD), or electron cyclotron resonance CVD (ECR-CVD), and then patterned by using a photolithographic dry or wet etching process.

The first, second, and third electrodes 120, 140, and 150 may be deposited by CVD or sputtering, and then patterned by photolithographic lift-off or dry etching. In this case, the first electrode 120 must have good adherence to the substrate 110, considering that the first electrode 120 is deposited on the substrate 110 beforehand. Also, since various thin films are deposited on the first electrode 120 according to subsequent processes, the first electrode 120 must have a smooth surface and enable easy edge-taper processing. In addition, the first electrode 120 must have strong resistance to various chemicals. In this regard, the first electrode 120 may be made of Cr, Ta, or an MoTa alloy. Al, anodized Al, or Al alloy such as Al—Nd and Al—Ta may also be used. The second and third electrodes 140 and 150 must have an ohmic contact with the inorganic semiconductor thin film 160 and resistance to various chemicals to be used in a subsequent process. In this regard, the second and third electrodes 140 and 150 may be made of Cr, Mo, or Ta. If the second and third electrodes 140 and 150 are made of Mo, an Mo/Al or Mo/Al/Mo structure is preferable.

Figure 3:
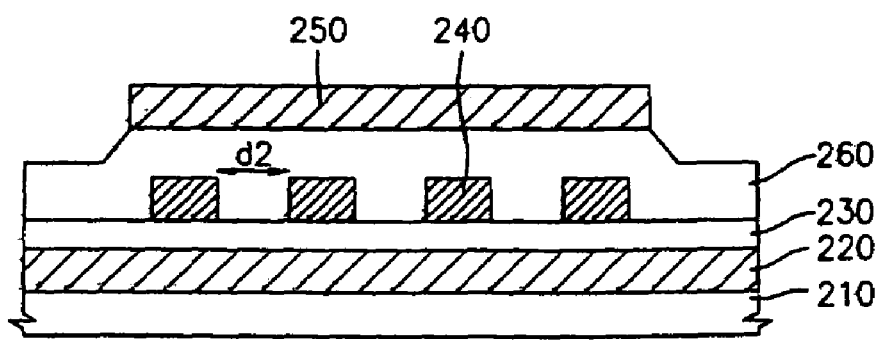
FIG. 3 is a view of a vertical structure organic semiconductor thin film transistor according to another embodiment of the present invention.

FIG. 3 is a view of a vertical structure organic TFT according to another embodiment of the present invention.

The organic TFT can be easily manufactured at low cost and can use a substrate with impact resistance and bending or folding property. Therefore, it is anticipated that the organic TFT will be used essentially in the pertinent art in the future. The organic TFT has low charge mobility, which is a general property of organic semiconductors. For this reason, the organic TFT cannot be used as a device which uses Si or Ge for a fast speed. However, the organic TFT can be used in the following cases: where a device must be manufactured over a large area, where a low process temperature is required, or where bending is required. In particular, the organic TFT can be efficiently used where a low cost process is required. An organic semiconductor thin film used in the organic TFT is formed by deposition, spin-coating, or inkjet printing at room temperature or low temperature (100° C. or less). For this reason, a plastic-based organic electronic circuit with an organic TFT can be manufactured.

Referring to FIG. 3, a first electrode 220, a dielectric thin film 230, a second electrode 240 made of Au, an organic semiconductor thin film 260, and a third electrode 250 made of Au are formed sequentially on a plastic substrate 210. In such a structure, current flows between the second electrode 240 and the third electrode 250 along a conduction path with a cross sectional area equal to the upper surface area of the second electrode 240. The direction of an electric field generated by the first electrode 220 is parallel to the direction of current. Where the second electrode 240 covers the whole surface of the dielectric thin film 230, the electric field generated from the first electrode 220 is interrupted by the second electrode 240. Therefore, it is preferable to divide the second electrode 240 into several electrode portions which are separated from each other by a predetermined gap d2, so that the electric field can act on the inorganic semiconductor thin film 260. If the gap d2 increases, a large amount of charge is induced due to a large electric field, but the current decreases. On the other hand, if the gap d2 decreases, the current increases, but the electric field insignificantly acts on the inorganic semiconductor thin film 260, thereby inducing a small amount of charge. Therefore, the electrode portions of the second electrode 240 must be separated from each other by an appropriate gap according to the device's demand. A passivation film (not shown) may be formed on the upper surface of the stacked structure shown in FIG. 3 to protect the stacked structure from external physical impacts or chemical pollutants. The passivation film may be made of an organic material, an inorganic material, or a liquid material such as fluorocarbon liquid.

The organic semiconductor thin film 260 may be made of an organic material or polymer, such as pentacene, polythiophene, and polyacetylene. Generally, the organic semiconductor thin film 260 is formed by spin coating a precursor material, followed by vacuum annealing at low temperature. In addition to spin coating, deposition or inkjet printing may be used. Doping may also be used to increase charge mobility. Patterning may be carried out using a shadow mask or using oxygen plasma etching after the formation of a protective film.

The substrate 210 may be a plastic substrate, in addition to a silicon or glass substrate. For example, a PPA resin which has good mechanical strength, polyimide, or polyethylene terephthalate may be used. When a voltage is applied to the first electrode 220, the dielectric thin film 230 allows charge from the inorganic semiconductor thin film 260 to concentrate on the interface between the dielectric thin film 230 and the inorganic semiconductor thin film 260 to form a channel, without a charge leakage into the first electrode 220. In this regard, the dielectric thin film 230 must be formed by deposition at low temperature and have a relatively good insulating property. For the formation of dielectric thin film 230, it is somewhat difficult to use an inorganic dielectric material such as SiNx and SiOx because CVD must be carried out at high temperature. For this reason, an organic dielectric material such as cyanoethylpullulan (CYEPL) and polymethyl methacrylate (PMMA) may be used.

As described above, the present invention provides a thin film transistor with a vertical structure. In the transistor, current flows perpendicularly to the surface of an inorganic or organic semiconductor thin film. Therefore, the cross-section of the current increases, thereby increasing the total current. Since current flows perpendicularly to the surface of the semiconductor thin film, the total current can significantly increase even when the semiconductor thin film has a low current density. Furthermore, since a second electrode is divided into several electrode portions spaced apart from each other, an electric field generated by a first electrode efficiently acts on an inorganic or organic thin film to thereby induce a charge. Therefore, a switching speed can significantly increase, which enables low-voltage driving.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical structure thin film transistor comprising a stacked structure of a substrate; a first electrode; a dielectric thin film; a second electrode including a metal element divided into a plurality of electrode portions, each electrode portion including a metal element; a semiconductor thin film; and a third electrode, wherein current directly flows from the second electrode to the third electrode perpendicularly to the substrate and is modulated by an electric field generated from the first electrode parallel to the current, and the dielectric thin film.

2. The vertical structure thin film transistor according to claim 1, wherein the first electrode, the dielectric thin film, the second electrode, the semiconductor thin film, and the third electrode are stacked sequentially on the substrate.

3. The vertical structure thin film transistor according to claim 1, wherein the third electrode, the semiconductor thin film, the second electrode, the dielectric thin film, and the first electrode are stacked sequentially on the substrate.

4. The vertical structure thin film transistor according to claim 1, wherein the substrate is a monocrystalline silicon, glass, or plastic substrate.

5. The vertical structure thin film transistor according to claim 1, wherein the semiconductor thin film is an inorganic semiconductor thin film.

6. The vertical structure thin film transistor according to claim 1, wherein the semiconductor thin film is an organic semiconductor thin film.

7. The vertical structure thin film transistor according to claim 1, wherein the plurality of electrode portions are spaced apart from each other so that the electric field generated from the first electrode acts on the semiconductor thin film to induce a charge.

8. A vertical structure thin film transistor comprising a stacked structure of a substrate; a first electrode; a dielectric thin film; a second electrode made of Au and divided into a plurality of electrode portions, each electrode portion made only of Au; a semiconductor thin film; and a third electrode, wherein current directly flows from the second electrode to the third electrode perpendicularly to the substrate and is modulated by an electric field generated from the first electrode parallel to the current, and the dielectric thin film.

* * * * *